US012640706B2

(12) United States Patent
Nakahashi

(10) Patent No.: US 12,640,706 B2
(45) Date of Patent: *May 26, 2026

(54) EXTRACTOR

(71) Applicant: Murata Manufacturing Co., Ltd.,
Nagaokakyo (JP)

(72) Inventor: Norihiko Nakahashi, Nagaokakyo (JP)

(73) Assignee: MURATA MANUFACTURING CO.,
LTD., Kyoto (JP)

( * ) Notice: Subject to any disclaimer, the term of this
patent is extended or adjusted under 35
U.S.C. 154(b) by 184 days.

This patent is subject to a terminal dis-
claimer.

(21) Appl. No.: 18/418,451

(22) Filed: Jan. 22, 2024

(65) Prior Publication Data

US 2024/0162885 A1 May 16, 2024

Related U.S. Application Data

(63) Continuation of application No. 17/315,405, filed on
May 10, 2021, now Pat. No. 11,923,828, which is a
(Continued)

(30) Foreign Application Priority Data

Nov. 20, 2018 (JP) ................................. 2018-216969

(51) Int. Cl.
*H03H 9/54* (2006.01)
*H03H 9/02* (2006.01)
(Continued)

(52) U.S. Cl.
CPC ........ *H03H 9/542* (2013.01); *H03H 9/02574*
(2013.01); *H03H 9/02818* (2013.01); *H03H*
*9/25* (2013.01); *H03H 9/72* (2013.01)

(58) Field of Classification Search
CPC .............. H03H 9/542; H03H 9/02574; H03H
9/02818; H03H 9/25; H03H 9/72
See application file for complete search history.

(56) References Cited

U.S. PATENT DOCUMENTS

| 11,923,828 B2 * | 3/2024 | Nakahashi | ............. | H03H 9/725 |
| 2016/0156335 A1 * | 6/2016 | Takeuchi | ................. | H03H 7/38 |
| | | | | 333/32 |

(Continued)

OTHER PUBLICATIONS

Nakahashi, "Extractor", U.S. Appl. No. 17/315,405, filed May 10,
2021.

*Primary Examiner* — Samuel S Outten
(74) *Attorney, Agent, or Firm* — Keating & Bennett, LLP

(57) ABSTRACT

An extractor includes an external connection terminal, a
common terminal, input-output terminals, a band elimina-
tion filter that is connected to the common terminal and the
first input-output terminal input-output terminal and that
uses a first frequency band as a stop band, a band pass filter
connected to the common terminal and the second input-
output terminal and that uses a second frequency band
overlapped with at least a portion of the first frequency band
as a pass band, and an inductor connected on a path
connecting the common terminal to the external connection
terminal. The band elimination filter includes series arm
resonators located on a series arm connecting the common
terminal to the input-output terminal and an inductor that is
located on the series arm between the series arm resonator
and the first input-output terminal. The inductor is induc-
tively coupled to the inductor.

22 Claims, 7 Drawing Sheets

Related U.S. Application Data continuation of application No. PCT/JP2019/045108, filed on Nov. 18, 2019.

(51) Int. Cl.
      *H03H 9/25*          (2006.01)
      *H03H 9/72*          (2006.01)

(56)                    References Cited

U.S. PATENT DOCUMENTS

| | | | | |
|---|---|---|---|---|
| 2016/0359470 | A1* | 12/2016 | Kuwahara | H03H 9/725 |
| 2017/0310305 | A1* | 10/2017 | Komura | H03H 9/64 |
| 2018/0041190 | A1* | 2/2018 | Yoshimura | H03H 1/0007 |
| 2018/0159507 | A1* | 6/2018 | Goto | H03H 9/02818 |

* cited by examiner

INDUCTIVE COUPLING

CAPACITIVE COUPLING

EXTRACTOR

CROSS REFERENCE TO RELATED APPLICATIONS

This application claims the benefit of priority to Japanese Patent Application No. 2018-216969 filed on Nov. 20, 2018 and is a Continuation Applications of PCT Application No. PCT/JP2019/045108 filed on Nov. 18, 2019. The entire contents of each application are hereby incorporated herein by reference.

BACKGROUND OF THE INVENTION

1. Field of the Invention

The present invention relates to an extractor including a band pass filter and a band elimination filter.

2. Description of the Related Art

Wireless terminal devices are required to support communications using different radio frequency bands and different radio systems, such as Cellular system communication and wireless fidelity (Wi-Fi) (registered trademark) and Global Positioning System (GPS) (registered trademark) communication, with one antenna. As one method to meet the above request, an extractor may be connected to the antenna of the wireless terminal device. In the extractor, a band pass filter (BPF) that transmits a radio-frequency signal having one wireless carrier frequency is combined with a band elimination filter (BEF) that does not transmit the radio-frequency signal having the wireless carrier frequency and that transmits a radio-frequency signal having another wireless carrier frequency.

An extractor is disclosed in International Publication No. 2018-168503, which has a configuration including the band elimination filter and the band pass filter that are connected to a common antenna.

SUMMARY OF THE INVENTION

However, in the extractor including the band pass filter and the band elimination filter that are combined with each other, isolation between the band pass filter and the band elimination filter is reduced in a frequency band higher than the stop band of the band elimination filter due to harmonic waves of the radio-frequency signal transmitted through the band pass filter. Accordingly, there is a problem in that the insertion loss of the band elimination filter is degraded in the frequency band higher than the above stop band.

Preferred embodiments of the present invention provide extractors each including a band elimination filter that achieves reduced insertion loss.

An extractor according to one aspect of a preferred embodiment of the present invention includes an external connection terminal, a common terminal, a first input-output terminal, and a second input-output terminal; a band elimination filter that is connected between the common terminal and the first input-output terminal and that uses a first frequency band as a stop band; a band pass filter that is connected between the common terminal and the second input-output terminal and that uses a second frequency band overlapped with at least a portion of the first frequency band as a pass band; and a first inductor connected in series or in parallel on a path connecting the common terminal to the external connection terminal. The band elimination filter includes one or more series arm resonators that each include an acoustic wave resonator and that are located on a series arm connecting the common terminal to the first input-output terminal and a second inductor that is located on the series arm between the first input-output terminal and the series arm resonator closest to the common terminal side, among the one or more series arm resonators. The first inductor is inductively coupled to the second inductor.

According to preferred embodiments of the present invention, it is possible to provide extractors each including a band elimination filter that achieves reduced insertion loss.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
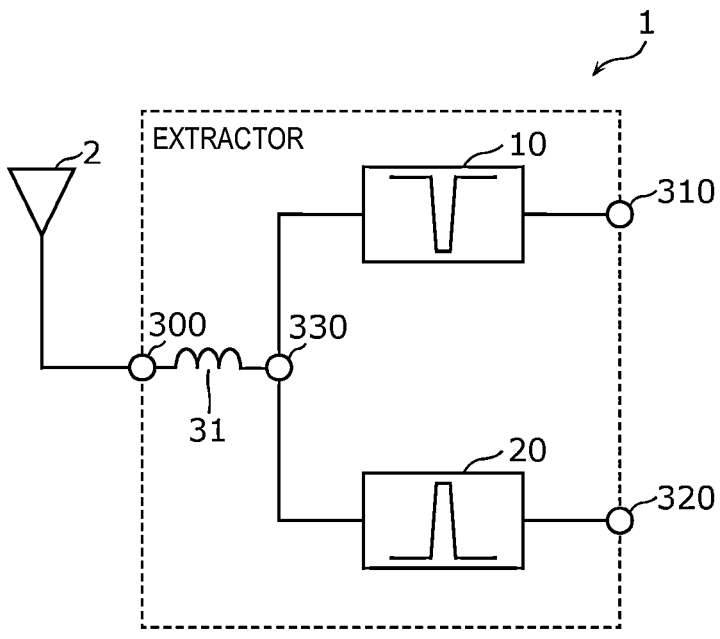
FIG. 1 is a block diagram illustrating a configuration of an extractor and an antenna according to a preferred embodiment of the present invention.

Preferred embodiments of the present invention will herein be described in detail with reference to examples and modifications with reference to the drawings. The examples and the modifications described below indicate comprehensive or specific examples. Numerical values, shapes, materials, components, the arrangement of the components, the connection mode of the components, and so on, which are indicated in the examples and the modifications described below, are only examples and are not intended to limit the present invention. Among the components in the examples and the modifications described below, the components that are not described in the independent claims are described as optional components. In addition, the sizes or the ratios of the sizes of the components illustrated in the drawings are not necessarily strictly indicated.

In the examples and the modifications described above, in A, B, and C that are mounted on a substrate, "C is not arranged between A and B in a plan view of the substrate (or the main surface of the substrate" is defined to mean that, in a plan view of the substrate, the area of C, which is projected in a plan view of the substrate, is not overlapped with a line connecting an arbitrary point on an outer side closest to B, among the sides defining the outer periphery of A, to an arbitrary point on an outer side closest to A, among the sides defining the outer periphery of B.

Preferred Embodiment

1. Configuration of Extractor

FIG. 1 is a block diagram illustrating the configuration of an extractor 1 and an antenna 2 according to a preferred embodiment of the present invention. As illustrated in FIG. 1, the extractor 1 includes an external connection terminal 300, a common terminal 330, input-output terminals 310 and 320, a band elimination filter 10, a band pass filter 20, and an inductor 31.

The band elimination filter 10 is connected between the common terminal 330 and the input-output terminal 310 (a first input-output terminal) and is a BEF that uses a first frequency band as a stop band.

The band pass filter 20 is connected between the common terminal 330 and the input-output terminal 320 (a second input-output terminal) and is a BPF using a second frequency band overlapped with at least a portion of the first frequency band as a pass band.

The inductor 31 is a first inductor connected on a path connecting the common terminal 330 to the external connection terminal 300. In the present preferred embodiment, one end of the inductor 31 is connected to the common terminal 330 and the other end thereof is connected to the external connection terminal 300. In other words, the inductor 31 is arranged in series on the path. In the case of the first inductor connected on the path, one end of the first inductor may be connected to a node on the path and the other end thereof may be grounded.

In other words, the band elimination filter 10 and the band pass filter 20 are connected to the external connection terminal 300 via the common terminal 330 and the inductor 31.

The external connection terminal 300 is a terminal to connect an external device to the extractor 1. The extractor 1 is connected to, for example, the antenna 2, as illustrated in FIG. 1.

With the above configuration, the extractor 1 transmits, for example, a Cellular radio-frequency signal and a Wi-Fi (registered trademark) and GPS (registered trademark) radio-frequency signal to the antenna 2 with high quality. In addition, the extractor 1 transmits the radio-frequency signal received from the antenna 2 to a radio-frequency (RF) signal processing circuit (not illustrated) via a filter, an amplifier circuit, and so on with high quality. The first frequency band and the second frequency band are, for example, frequency bands having narrow bandwidths used in the Wi-Fi (registered trade mark) communication and frequency bands having narrow bandwidths used in the GPS (registered trademark) communication. For example, frequency bands having wide bandwidths used in the Cellular system communication are included in the frequency bands excluding the first frequency band and the second frequency band.

2. Circuit Configuration of Band Elimination Filter and Band Pass Filter

Figure 2:
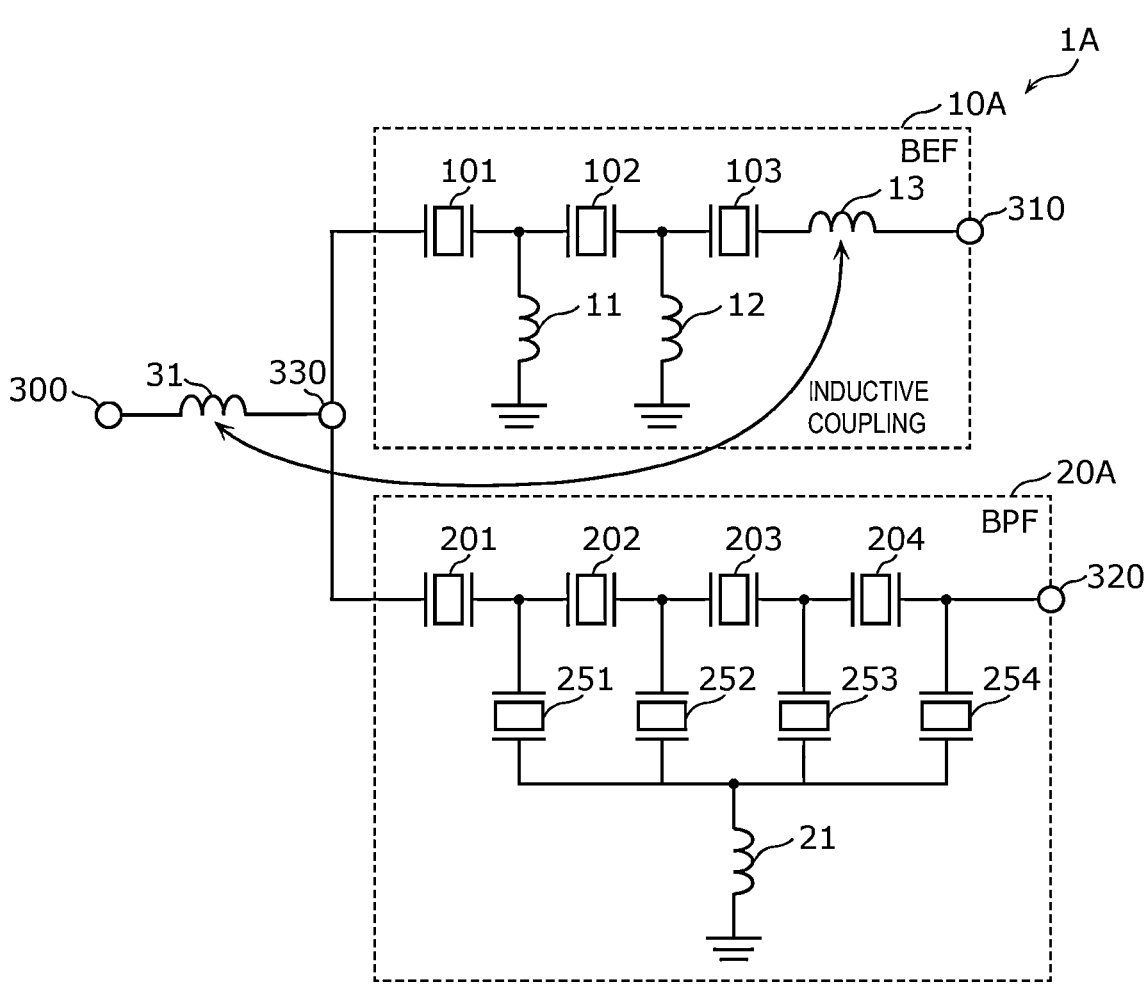
FIG. 2 is a diagram illustrating a circuit configuration of an extractor according to an example of a preferred embodiment of the present invention.

FIG. 2 is a diagram illustrating the circuit configuration of an extractor 1A according to an example. As illustrated in FIG. 2, the extractor 1A includes the external connection terminal 300, the common terminal 330, the input-output terminals 310 and 320, a band elimination filter 10A, a band pass filter 20A, and the inductor 31. The extractor 1A according to the example is a specific example of the extractor 1 according to the present preferred embodiment.

The band elimination filter 10A is a specific example of the band elimination filter 10 according to the present preferred embodiment and includes series arm resonators 101, 102, and 103 and inductors 11, 12, and 13.

The series arm resonators 101 to 103 are arranged in series on a series arm connecting the common terminal 330 to the input-output terminal 310 and each include an acoustic wave resonator. The number of the series arm resonators in the band elimination filter 10A is not limited to three and one or more series arm resonators may be provided in the band elimination filter 10A.

The inductor 13 is a second inductor arranged on a series arm connecting the series arm resonators 101 to 103 to the input-output terminal 310. In the present preferred embodiment, the inductor 13 is located on the series arm between the series arm resonator 103 and the input-output terminal 310 and is connected to the input-output terminal 310 via no element. The inductor 13 (the second inductor) arranged on the series arm may not be connected to the input-output terminal 310. For example, the inductor 13 (the second inductor) may be connected on the series arm between the series arm resonators 101 and 102 or may be connected on the series arm between the series arm resonators 102 and 103. Specifically, the inductor 13 is located on the series arm between the input-output terminal 310 and the series arm resonator 101 closest to the common terminal 330 side, among the series arm resonators 101 to 103.

The band elimination filter 10A includes third inductors arranged on parallel arms connecting nodes on the series arm to the ground. The inductor 11 is the third inductor arranged on the parallel arm connecting a node on the series arm between the series arm resonators 101 and 102 to the ground. The inductor 12 is the third inductor arranged on the parallel arm connecting a node on the series arm between the series arm resonators 102 and 103 to the ground.

With the above configuration of the band elimination filter 10A, since the series arm resonators 101 to 103 each including the acoustic wave resonator are located on the series arm path, it is possible to realize the band elimination filter having the steeper stop band and the pass band with low loss. In addition, since the inductors 11 and 12 are located on the parallel arm paths, it is possible to realize the band elimination filter having the wide pass band. The inductors 11 and 12 may not be provided or may be replaced with passive elements of another kind, such as capacitors.

The band pass filter 20A is a specific example of the band pass filter 20 according to the present preferred embodiment. The band pass filter 20A includes series arm resonators 201, 202, 203, and 204, parallel arm resonators 251, 252, 253, and 254, and an inductor 21.

The series arm resonators 201 to 204 are located on a series arm connecting the common terminal 330 to the input-output terminal 320 and each include an acoustic wave resonator.

The respective parallel arm resonators 251 to 254 are located on parallel arms connecting different nodes on the series arm to the ground and each include an acoustic wave resonator.

The inductor 21 is a fourth inductor arranged on a path connecting the parallel arm resonators 251 to 254 to the ground.

With the above configuration of the band pass filter 20A, since the series arm resonators 201 to 204 each including the acoustic wave resonator are located on the series arm path and the parallel arm resonators 251 to 254 each including the acoustic wave resonator are located on the parallel arm paths, it is possible to realize the ladder-type acoustic wave filter having the pass band with low loss and the steepness of a transition band from the pass band to an attenuation band. In addition, since the inductor 21 is located on the parallel arm path, it is possible to adjust and optimize the frequency of an attenuation pole and the attenuation in the attenuation band.

The number of the series arm resonators in the band pass filter 20A is not limited to four and one or more series arm resonators may be provided in the band pass filter 20A. The number of the parallel arm resonators arranged on the parallel arms are not limited to four and one or more inductors may be provided. An arbitrary number of the inductors may be connected between the parallel arm resonators and the ground or no inductor may be connected between the parallel arm resonators and the ground.

Each acoustic wave resonator defining the band elimination filter 10A and the band pass filter 20A may be either of a surface acoustic wave resonator and an acoustic wave resonator using bulk acoustic waves (BAWs). The surface acoustic waves include, for example, surface acoustic waves, Love waves, leaky waves, Rayleigh waves, boundary waves, leaky surface acoustic waves (SAWs), pseudo SAWs, and plate waves.

With the above configuration, it is possible to realize the band elimination filter 10A and the band pass filter 20A with lower loss and with higher steepness.

The band pass filter 20A may not include the acoustic wave resonators and may include LC resonant filters, dielectric filters, or LC filters. The filter may have an arbitrary structure.

The inductor 31 is inductively coupled to the inductor 13.

In the extractor in related art, in which the band elimination filter and the band pass filter are connected to the common terminal, isolation between the band elimination filter and the band pass filter is degraded at the frequency side higher than the stop band of the band elimination filter due to harmonic waves caused by non-linearity of the band pass filter. Accordingly, the insertion loss is degraded in the frequency band higher than the stop band of the band elimination filter.

In contrast, with the above configuration of the extractor LA according to the example, since the inductor 31 is inductively coupled to the inductor 13, the radio-frequency signal in the frequency band higher than the stop band is capable of being preferentially transmitted on a bypass path through the external connection terminal 300, the inductors 31 and 13, and the input-output terminal 310 not through the series arm resonators 101 to 103. Accordingly, the amount corresponding to the degradation in the insertion loss in the frequency band higher than the stop band is capable of being compensated with the bypass path caused by the inductive coupling in bandpass characteristics of the band elimination filter 10A. In other words, it is possible to reduce the insertion loss in the frequency band higher than the stop band.

The inductor 13 is connected to the input-output terminal 310 in the present preferred embodiment.

With the above configuration, the degree of freedom to preferentially transmit the radio-frequency signal in the frequency band higher than the stop band on the bypass path only through the external connection terminal 300, the inductors 31 and 13, and the input-output terminal 310 not through all the series arm resonators 101 to 103 in the band elimination filter 10A (to adjust the amplitude and the phase) is increased. Accordingly, the amount corresponding to the degradation in the insertion loss in the frequency band higher than the stop band is capable of being optimally compensated with the bypass path caused by the inductive coupling in the bandpass characteristics of the band elimination filter 10A.

In the extractor 1 according to the present preferred embodiment (the extractor 1A according to the example), the inductor 31 is an impedance element to match the impedance of an external circuit (for example, the antenna 2) connected to the external connection terminal 300 with the combined impedance of the band elimination filter 10 and the band pass filter 20.

With this configuration, since the bypass path includes the inductor 31 for the impedance matching with the external circuit, it is not necessary to add the circuit element for forming the bypass path, in addition to the band elimination filter 10 (the band elimination filter 10A). Accordingly, it is possible to reduce the insertion loss in the frequency band higher than the stop band of the band elimination filter 10 (the band elimination filter 10A) while reducing the size of the extractor 1 (the extractor TA).

The principle and the function of reducing the insertion loss of the band elimination filter 10A in the extractor 1A according to the example, compared with the extractor in the related art, will now be described in detail.

3. Structure of Acoustic Wave Resonator

Figure 3A:
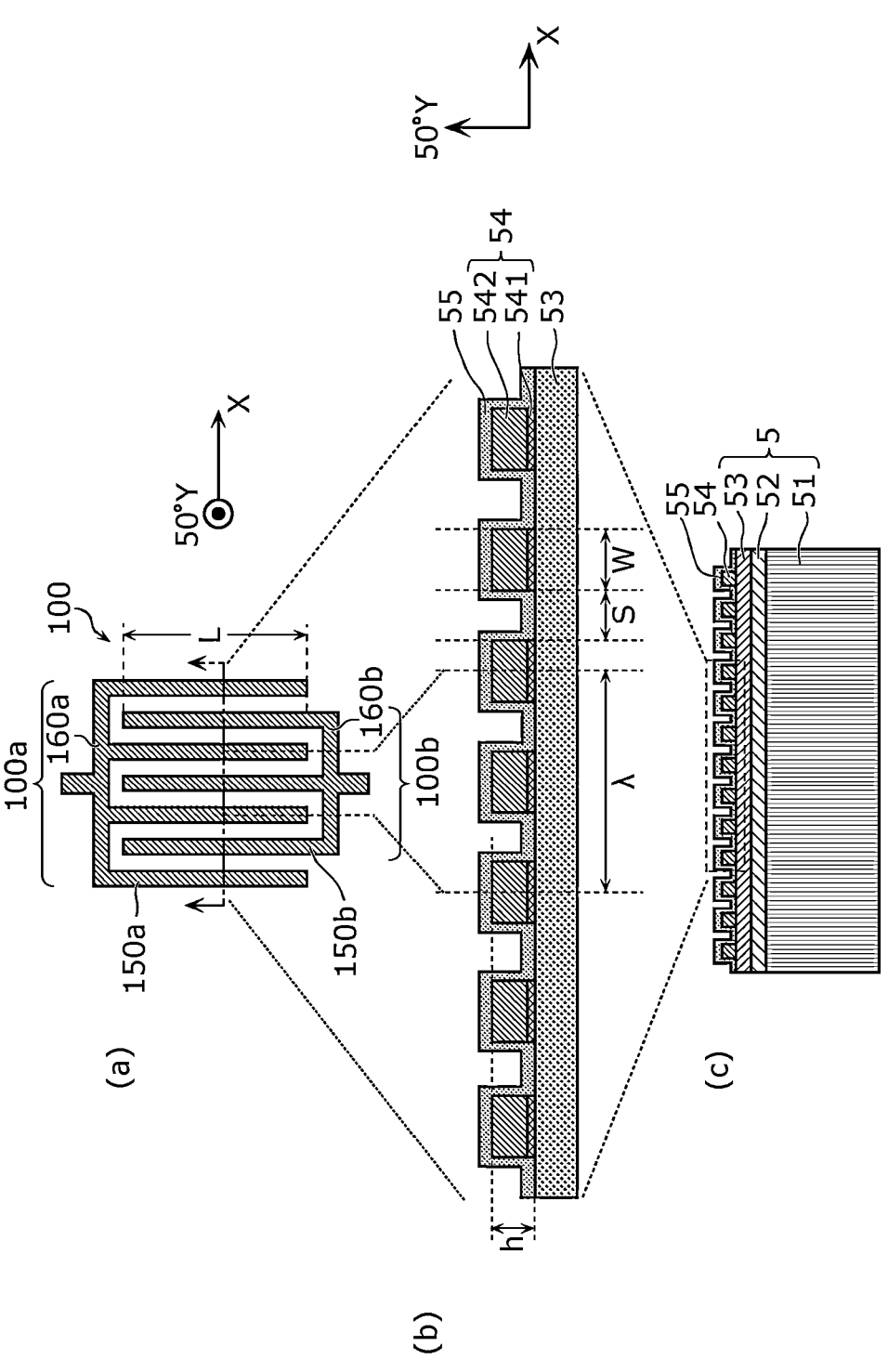
FIG. 3A includes a plan view and cross-sectional views schematically illustrating an example of an acoustic wave resonator according to an example of a preferred embodiment of the present invention.

FIG. 3A includes schematic views schematically illustrating an example of the acoustic wave resonator according to the example. In FIG. 3A, (a) is a plan view, and (b) and (c) are cross-sectional views taken along an alternate long and short dash line illustrated in (a). An acoustic wave resonator 100 is exemplified in FIG. 3A, which has the basic structure of the series arm resonators 101, 102, and 103 defining the band elimination filter 10A and the series arm resonators 201 to 204 and the parallel arm resonators 251 to 254 defining the band pass filter 20A. The acoustic wave resonator 100 illustrated in FIG. 3A is exemplified for describing the typical structure of the acoustic wave resonator and the number, the lengths, and so on of electrode fingers defining the electrodes are not limited to the ones illustrated in FIG. 3A.

The acoustic wave resonator 100 includes a substrate 5 having piezoelectricity and interdigital electrodes 100a and 100b.

As illustrated in (a) in FIG. 3A, the pair of the interdigital electrodes 100a and 100b opposed to each other is located on the substrate 5. The interdigital electrode 100a includes multiple electrode fingers 150a parallel to each other and a busbar electrode 160a with which the multiple electrode fingers 150a are connected. The interdigital electrode 100b includes multiple electrode fingers 150b parallel to each other and a busbar electrode 160b with which the multiple electrode fingers 150b are connected. The multiple electrode fingers 150a and 150b are arranged along a direction orthogonal to the direction in which the acoustic waves are propagated (the X-axis direction).

An interdigital transducer (IDT) electrode 54 including the multiple electrode fingers 150a and 150b and the busbar electrodes 160a and 160b has a laminated structure including a close-contact layer 541 and a main electrode layer 542, as illustrated in (b) in FIG. 3A.

The close-contact layer 541 is a layer to improve the adhesiveness between the substrate 5 and the main electrode layer 542 and, for example, Ti is used as the material of the close-contact layer 541. The film thickness of the close-contact layer 541 is, for example, about 12 nm.

For example, Al containing 1% of Cu is used as the material of the main electrode layer 542. The film thickness of the main electrode layer 542 is, for example, about 162 nm.

A protective layer 55 is formed so that the interdigital electrodes 100a and 100b are covered with the protective layer 55. The protective layer 55 is a layer aimed at protection of the main electrode layer 542 from the external environment, adjustment of frequency temperature characteristics, increase of the moisture resistance, and so on. The protective layer 55 is, for example, a dielectric film containing silicon dioxide as the principal component. The thickness of the protective layer 55 is, for example, about 25 nm.

The materials defining the close-contact layer 541, the main electrode layer 542, and the protective layer 55 are not limited to the materials described above. The IDT electrode 54 may not have the above laminated structure. The IDT electrode 54 may be made of metal, such as Ti, Al, Cu, Pt, Au, Ag, or Pd, or alloy thereof or may include multiple multilayer bodies made of the above metal or alloy. The protective layer 55 may not be provided.

The laminated structure of the substrate 5 will now be described.

As illustrated in (c) in FIG. 3A, the substrate 5 includes a high acoustic velocity supporting substrate 51, a low acoustic velocity film 52, and a dielectric film 53 and has a structure in which the high acoustic velocity supporting substrate 51, the low acoustic velocity film 52, and the dielectric film 53 are laminated in this order.

The dielectric film 53 is made of 50° Y-cut X-propagating LiTaO$_3$ piezoelectric single crystal or piezoelectric ceramics (lithium tantalate single crystal or ceramics cut along a plane with a normal line, which is the axis rotated around the X axis from the Y axis by 50°, and single crystal or ceramics in which the surface acoustic waves are propagated in the X-axis direction). The dielectric film 53 has a thickness of, for example, about 600 nm. The material and the cut angle of the piezoelectric single crystal used as the dielectric film 53 are appropriately selected based on required specifications of each filter.

The high acoustic velocity supporting substrate 51 is a substrate supporting the low acoustic velocity film 52, the dielectric film 53, and the IDT electrode 54. In addition, the high acoustic velocity supporting substrate 51 is a substrate in which the acoustic velocity of the bulk waves in the high acoustic velocity supporting substrate 51 is higher than that of the acoustic waves, such as the surface acoustic waves and the boundary waves, propagated through the dielectric film 53. The high acoustic velocity supporting substrate 51 functions so as to confine the surface acoustic waves in a portion where the dielectric film 53 and the low acoustic velocity film 52 are laminated not to cause leakage of the surface acoustic waves below the boundary between the low acoustic velocity film 52 and the high acoustic velocity supporting substrate 51. The high acoustic velocity supporting substrate 51 is, for example, a silicon substrate and has a thickness of, for example, about 200 μm.

The low acoustic velocity film 52 is a film in which the acoustic velocity of the bulk waves in the low acoustic velocity film 52 is lower than that of the bulk waves propagated through the dielectric film 53 and is arranged between the dielectric film 53 and the high acoustic velocity supporting substrate 51. This structure and the property of the acoustic waves, the energy of which is intrinsically concentrated on a medium of a low acoustic velocity, suppress the leakage of the energy of the surface acoustic waves to the outside of the IDT electrode. The low acoustic velocity film 52 is a film containing silicon dioxide as the principal component and has a thickness of, for example, about 670 nm.

With the above laminated structure of the substrate 5, it is possible to greatly increase the Q values in a resonant frequency and an anti-resonant frequency, compared with the structure in the related art, which uses a single-layer piezoelectric substrate. In other words, since the acoustic wave resonator having the high Q values can be provided, it is possible for the filter to achieve low insertion loss using the acoustic wave resonator.

The high acoustic velocity supporting substrate 51 may have a structure in which the supporting substrate and a high acoustic velocity film are laminated. In the high acoustic velocity film, the acoustic velocity of the bulk waves propagated through the high acoustic velocity film is higher than that of the acoustic waves, such as the surface acoustic waves and the boundary waves, propagated through the dielectric film 53. In this case, for example, a piezoelectric body made of lithium tantalate, lithium niobate, or crystal; various ceramics including sapphire, alumina, magnesia, silicon nitride, aluminum nitride, silicon carbide, zirconia, cordierite, mullite, steatite, and forsterite; a dielectric body made of glass or silicon; semiconductor, such as gallium nitride; and a resin substrate may be used for the supporting substrate. Various high acoustic velocity materials including aluminum nitride, aluminum oxide, silicon carbide, silicon nitride, silicon oxynitride, a diamond-like carbon (DLC) film or diamond, a medium containing either of the above materials as the principal component, and a medium containing a mixture of the above materials as the principal component may be used for the high acoustic velocity film.

Figure 3B:
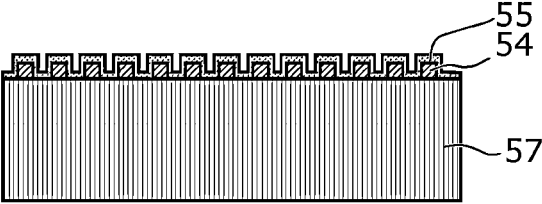
FIG. 3B is a cross-sectional view schematically illustrating a modification of an acoustic wave resonator of a preferred embodiment of the present invention.

FIG. 3B is a cross-sectional view schematically illustrating a modification of the acoustic wave resonator. Although the example in which the IDT electrode 54 is provided on the substrate 5 including the dielectric film 53 is described in the acoustic wave resonator 100 illustrated in FIG. 3A, the substrate on which the IDT electrode 54 is provided may be a piezoelectric single crystal substrate 57 including a single piezoelectric layer, as illustrated in FIG. 3B. The piezoelectric single crystal substrate 57 is made of, for example, LiNbO$_3$ piezoelectric single crystal. The acoustic wave resonator 100 according to the present modification includes the piezoelectric single crystal substrate 57 made of LiNbO$_3$, the IDT electrode 54, and the protective layer 55 provided on the piezoelectric single crystal substrate 57 and on the IDT electrode 54.

As for the dielectric film 53 and the piezoelectric single crystal substrate 57 described above, only the laminated structure, the material, the cut angle, and the thickness may be appropriately varied depending on required bandpass characteristics and so on of the acoustic wave filter apparatus. Even in the case of the acoustic wave resonator 100 using a LiTaO$_3$ piezoelectric substrate or the like having a cut angle other than the cut angle described above, the same advantages as those of the acoustic wave resonator 100 using the dielectric film 53 described above are achieved.

The substrate on which the IDT electrode 54 is provided may have a structure in which the supporting substrate, an energy confinement layer, and the piezoelectric film are laminated in this order. The IDT electrode 54 is provided on the dielectric film. For example, LiTaO$_3$ piezoelectric single crystal or piezoelectric ceramics is used for the dielectric film. The supporting substrate is a substrate supporting the dielectric film, the energy confinement layer, and the IDT electrode 54.

The energy confinement layer includes one layer or multiple layers and the acoustic velocity of acoustic bulk waves propagated through at least one of the layers is higher than the acoustic velocity of the acoustic waves propagated near the dielectric film. For example, the energy confinement layer may have a laminated structure including a low acoustic velocity layer and a high acoustic velocity layer. The low acoustic velocity layer is a film in which the acoustic velocity of the bulk waves in the low acoustic velocity layer is lower than the acoustic velocity of the bulk waves propagated through the piezoelectric film. The high acoustic velocity layer is a film in which the acoustic velocity of the bulk waves in the high acoustic velocity layer is higher than the acoustic velocity of the acoustic waves propagated through the piezoelectric film. The high acoustic velocity layer may be used as the supporting substrate.

The energy confining layer may be an acoustic impedance layer having a configuration in which low acoustic impedance layers having a relatively low acoustic impedance and high acoustic impedance layers having a relatively high acoustic impedance are alternately laminated.

An example of electrode parameters of the IDT electrode defining the acoustic wave resonator 100 will now be described.

The wavelength of the acoustic wave resonator is defined as a wavelength λ, which is a repetition period of the multiple electrode finger 150a or 150b defining the IDT electrode 54 illustrated in (b) in FIG. 3A. The electrode pitch is ½ of the wavelength λ and is defined as (W+S) where the line width of the electrode fingers 150a and 150b defining the interdigital electrodes 100a and 100b is denoted by W and the space width between the electrode finger 150a and the electrode finger 150b that are adjacent to each other is denoted by S. An intersecting width L of one pair of the interdigital electrodes 100a and 100b is the length of the electrode fingers that are overlapped with each other when the electrode fingers 150a and the electrode fingers 150b are viewed from the direction in which the acoustic waves are propagated (the X-axis direction), as illustrated in (a) in FIG. 3A. The electrode duty of each acoustic wave resonator is the ratio of occupancy of the line width of the multiple electrode fingers 150a and 150b. The electrode duty of each acoustic wave resonator is the ratio of the line width with respect to the value of addition of the line width of the multiple electrode fingers 150a and 150b to the space width thereof and is defined as W/(W+S). The number N of pairs of the IDT electrode 54 is the average of the number of the multiple electrode fingers 150a and the number of the multiple electrode fingers 150b when the electrode finger 150a and electrode finger 150b that are adjacent to each other is paired.

The height of the interdigital electrodes 100a and 100b is denoted by h. The parameters, such as the wavelength λ, the intersecting width L, the electrode duty, the number of pairs of the IDT, and the height h of the IDT electrode 54, concerning the shape of the IDT electrode of the acoustic wave resonator are hereinafter referred to as the electrode parameters.

4. Arrangement Configuration of Inductors Inductively Coupled to Each Other

Figure 4A:
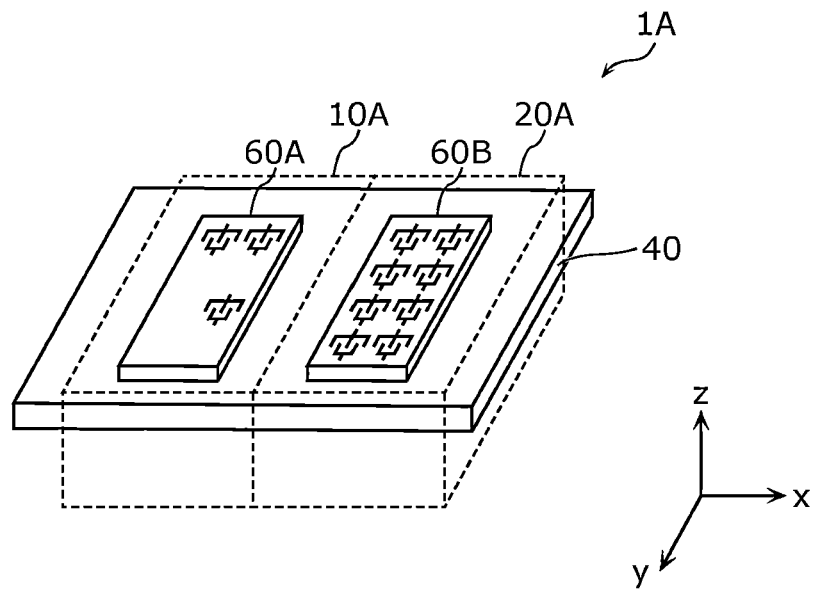
FIGS. 4A and 4B include external perspective views of an extractor according to an example of a preferred embodiment of the present invention and a substrate plan view illustrating an example of a configuration of inductors in the extractor.
Figure 4B:
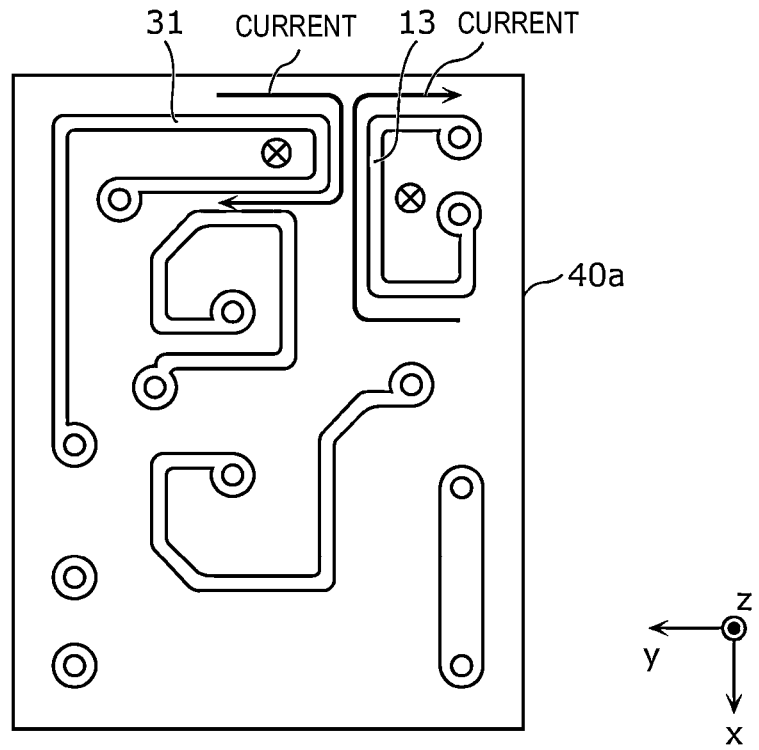

FIGS. 4A and 4B include external perspective views of the extractor 1A according to the example and a plan view illustrating an example of the arrangement configuration of the inductors. The external perspective view of the extractor 1A is illustrated in FIG. 4A and the arrangement configuration of the inductors incorporated in the substrate defining the extractor 1A is illustrated in FIG. 4B.

As illustrated in FIG. 4A, the extractor LA includes a mounting substrate 40 and substrates 60A and 60B having the piezoelectricity. The mounting substrate 40 is a multilayer substrate in which multiple layers are laminated and is exemplified by, for example, a ceramic multilayer substrate or a printed circuit board (PCB) substrate.

The band elimination filter 10A and the band pass filter 20A include, for example, surface acoustic wave resonators. The IDT electrodes defining the series arm resonators 101 to 103 in the band elimination filter 10A are provided on the substrate 60A. The IDT electrodes defining the series arm resonators 201 to 204 and the parallel arm resonators 251 to 254 in the band pass filter 20A are provided on the substrate 60B. The inductors 11 to 13, 21, and 31 are provided in the mounting substrate 40.

The substrates 60A and 60B are mounted on the mounting substrate 40, and the IDT electrodes on the substrates 60A and 60B are electrically connected to the inductors in the mounting substrate 40 via connection electrodes arranged on the mounting substrate 40. The substrates 60A and 60B may be one substrate. In other words, the IDT electrodes defining the series arm resonators 101 to 103 in the band elimination filter 10A and the IDT electrodes defining the series arm resonators 201 to 204 and the parallel arm resonators 251 to 254 in the band pass filter 20A may be provided on one substrate.

The band elimination filter 10A and the band pass filter 20A may be incorporated in the mounting substrate 40. A portion of each filter may be incorporated in the mounting substrate 40 and the remaining portion thereof may be mounted on the mounting substrate 40.

A planar wiring pattern provided on a layer 40a, which is one layer of the multiple layers defining the mounting substrate 40, is illustrated in FIG. 4B. The inductors 13 and 31 each include a planar coil pattern provided on the layer 40a.

As illustrated in FIG. 4B, in a plan view of the layer 40a, current flows in a clockwise direction on both the planar coil pattern of the inductor 13 and the planar coil pattern of the inductor 31. The direction of magnetic flux of the planar coil pattern of the inductor 13 is the same as that of the planar coil pattern of the inductor 31. In the present preferred embodiment, the two magnetic fluxes have the same direction is defined to mean that the angle between the vectors of the two directions of magnetic flux is higher than or equal to 0 degrees and lower than or equal to about 45 degrees, for example.

With the above configuration, the inductors 13 is inductively coupled to the inductor 31 because the inductor 13 and the inductor 31 have the same direction of magnetic flux and a wider adjustment width of the degree of inductive coupling is ensured. Accordingly, it is possible to accurately adjust priority passing of the radio-frequency signal in the frequency band higher than the first frequency band (the stop band of the band elimination filter 10A) owing to the bypass path while reducing the size of the extractor LA.

In addition, the winding axis direction of the planar coil pattern defining the inductor 13 is the same as the winding axis direction of the planar coil pattern defining the inductor 31. In the present preferred embodiment, the two winding axes have the same direction is defined to mean that the angle between the two winding axes is higher than or equal to 0 degrees and lower than or equal to formed on 45 degrees, for example.

As illustrated in FIG. 4B, no conductive member is arranged between the inductor 13 and the inductor 31. Accordingly, it is possible to ensure the high degree of inductive coupling between the inductor 13 and the inductor 31. However, the conductive member may be arranged between the inductor 13 and the inductor 31.

The inductors 13 and 31 may not include the planar coil patterns in the mounting substrate 40 and may be chip inductors mounted on the mounting substrate 40. Also in this

12

Figure 5:
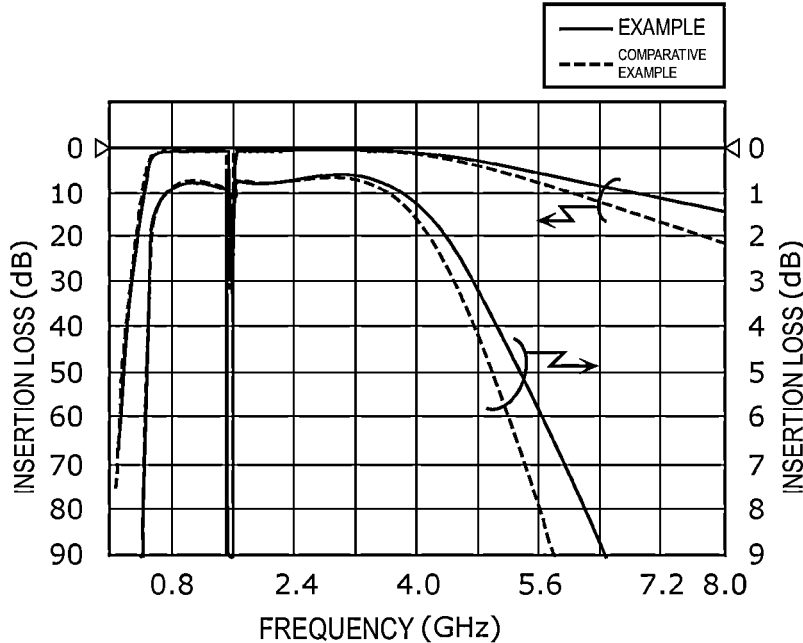
FIG. 5 is a graph indicating a result of comparison of bandpass characteristics between the band elimination filter according to an example of a preferred embodiment of the present invention and a band elimination filter according to a comparative example.

5. Comparison Between Extractor According to Example and Extractor According to Comparative Example FIG. 5 is a graph indicating a result of comparison of the bandpass characteristics between the band elimination filter according to the example and a band elimination filter according to a comparative example. The band elimination filter 10A according to the example has the circuit configuration illustrated in FIG. 2 and the band elimination filter according to the comparative example has the circuit configuration in which the inductors 13 and 31 are not inductively coupled to each other in the circuit configuration illustrated in FIG. 2.

Table 1 indicates the electrode parameters and the inductance values of the inductors of the extractor according to the example. The respective parameters of the extractor according to the comparative example are the same as those of the extractor LA according to the example except that the inductors 13 and 31 are not inductively coupled to each other.

TABLE 1

| | Band elimination filter 10A (Example) | | |
| --- | --- | --- | --- |
| | Series arm resonator 101 | Series arm resonator 102 | Series arm resonator 103 |
| Number of pairs of IDT (Pairs) | 210 | 180 | 210 |
| Intersecting width (μm) | 70 | 30 | 42 |
| Electrode duty | 0.60 | 0.60 | 0.60 |
| IDT wavelength (μm) | 2.51 | 2.53 | 2.56 |
| | Inductor 11 | Inductor 12 | Inductor 13 |
| Inductance value (nH) | 8.0 | 9.1 | 3.2 |

| | Band pass filter 20A (Example) | | | |
| --- | --- | --- | --- | --- |
| | Series arm resonator 201 | Series arm resonator 202 | Series arm resonator 203 | Series arm resonator 204 |
| Number of pairs of IDT (Pairs) | 59 | 196 | 95 | 117 |
| Intersecting width (μm) | 30 | 30 | 30 | 30 |
| Electrode duty | 0.60 | 0.60 | 0.60 | 0.60 |
| IDT wavelength (μm) | 2.43 | 2.43 | 2.42 | 2.45 |
| | Parallel arm resonator 251 | Parallel arm resonator 252 | Parallel arm resonator 253 | Parallel arm resonator 254 |
| Number of pairs of IDT (Pairs) | 50 | 152 | 128 | 112 |
| Intersecting width (μm) | 30 | 30 | 30 | 30 |
| Electrode duty | 0.60 | 0.60 | 0.60 | 0.60 |
| IDT wavelength (μm) | 2.53 | 2.54 | 2.56 | 2.54 |
| | Inductor 21 | | | |
| Inductance value (nH) | 0.1 | | | |
| | Inductor 31 | | | |
| Inductance value (nH) | 0.28 | | | | mounting configuration, arranging the inductors 13 and 31 so that the direction of magnetic flux of the inductor 13 is the same as the direction of magnetic flux of the inductor 31 enables the priority passing of the radio-frequency signal in the frequency band higher than the first frequency band (the stop band of the band elimination filter 10A) to be accurately adjusted owing to the bypass path.

Each of the inductors 13 and 31 may include multiple planar coil patterns provided on multiple layers defining the mounting substrate 40.

The coupling coefficient between the inductor 13 and the inductor 31 is about +0.2 in the extractor 1A according to the example, although the coupling coefficient is not indicated in Table 1. In contrast, in the extractor according to the comparative example, the coupling coefficient between the inductor 13 and the inductor 31 is zero (0). In other words, the inductor 13 is inductively coupled to the inductor 31 in the extractor LA according to the example while the inductor 13 is not inductively coupled to the inductor 31 in the extractor according to the comparative example.

As illustrated in FIG. 5, the band elimination filter 10A is a BEF using the GPS (registered trademark) band (the center frequency: 1,575.42 MHz) as the stop band. In the bandpass characteristics of the band elimination filter illustrated in FIG. 5, there is not a significant difference of the insertion loss between the band elimination filter 10A according to the example and the band elimination filter according to the comparative example in the stop band, the pass band at the low frequency side of the stop band, and the pass band at the high frequency side near the stop band. In contrast, the insertion loss at the frequency side higher than 3 GHz in the band elimination filter 10A according to the example is lower than that in the band elimination filter according to the comparative example (is improved, compared with the band elimination filter according to the comparative example).

In the extractor according to the comparative example, the isolation between the band elimination filter and the band pass filter is degraded in the frequency band higher than the stop band of the band elimination filter (in the frequency band higher than or equal to 3 GHz) due to (second) harmonic waves of the radio-frequency signal in the GPS (registered trademark) band, which are caused by the nonlinearity of the band pass filter. Accordingly, the insertion loss is degraded in the frequency band higher than the stop band of the band elimination filter (in the frequency band higher than or equal to 3 GHz).

In contrast, in the extractor LA according to the example, since the inductor 13 is inductively coupled to the inductor 31 with the coupling coefficient of about 0.2, the bypass path through the external connection terminal 300, the inductors 31 and 13, and the input-output terminal 310 is formed not through the series arm resonators 101 to 103. This bypass path has the bandpass characteristics in which the radio-frequency signal in the frequency band higher than the stop band (the first frequency band) of the band elimination filter 10A is transmitted owing to the inductive coupling.

In other words, the inductor 13 and the inductor 31 are arranged so that the radio-frequency signal in the frequency band higher than the stop band of the band elimination filter 10A is transmitted on the bypass path owing to the inductive coupling between the inductors 13 and 31.

With the above configuration, on the bypass path, the radio-frequency signal in the stop band is not transmitted and the radio-frequency signal in the frequency band higher than the stop band is capable of being preferentially transmitted. Accordingly, the amount corresponding to the degradation in the insertion loss in the frequency band higher than the stop band is capable of being compensated with the bypass path caused by the inductive coupling in the bandpass characteristics of the band elimination filter 10A. As a result, it is possible to reduce the insertion loss in the frequency band higher than the stop band.

Figure 6A:
FIG. 6A is a graph indicating a result of comparison of the bandpass characteristics when the degree of inductive coupling of the band elimination filter according to an example of a preferred embodiment of the present invention is varied.
Figure 6A:
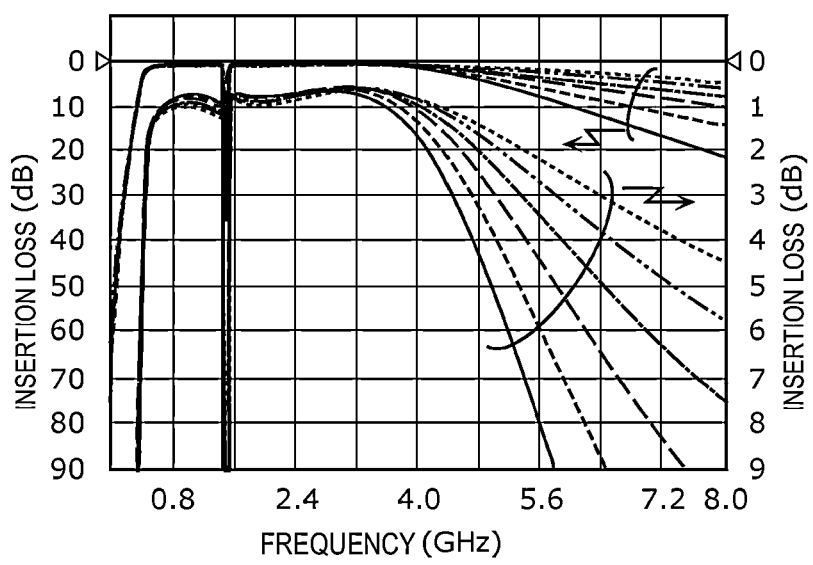
Figure 6A:
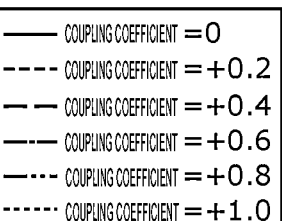

FIG. 6A is a graph indicating a result of comparison of the bandpass characteristics when the degree of inductive coupling between the inductors 13 and 31 is varied in the band elimination filter 10A according to the example. More specifically, the bandpass characteristics when the degree of inductive coupling (the coupling coefficient) between the inductors 13 and 31 is varied from about +0.2 to about +1.0 in the band elimination filter 10A according to the example and the bandpass characteristics (the coupling coefficient is 0) in the band elimination filter according to the comparative example are illustrated in FIG. 6A.

As illustrated in FIG. 6A, the insertion loss in the frequency band higher than the stop band of the band elimination filter 10A (in the frequency band higher than or equal to 3.0 GHz) is improved as the coupling coefficient between the inductors 13 and 31 is increased from 0 to about +1.0.

Accordingly, the coupling coefficient between the inductor 13 and the inductor 31 is desirably higher than 0 and lower than or equal to about +1.0. In other words, it is sufficient for the inductors 13 and 31 to be inductively coupled to each other.

The configurations to further increase the coupling coefficient between the inductors 13 and 31 are exemplified by (1) the distance between the inductor 13 and the inductor 31 is decreased, (2) the direction of magnetic flux of the inductor 13 is made more parallel to the direction of magnetic flux of the inductor 31 (the angle between the two directions of magnetic flux is made close to 0), and (3) the configuration is adopted in which no conductive member is arranged between the inductor 13 and the inductor 31. Since the inductor 31 has a function to achieve the impedance matching with the external circuit and the inductor 13 has a function to optimize the bandpass characteristics via the series arm resonators 101 to 103 in the band elimination filter 10A, it is desirable that the inductance values of the inductors 13 and 31 be not varied as the method to increase the coupling coefficient while keeping the above functions.

Figure 6B:
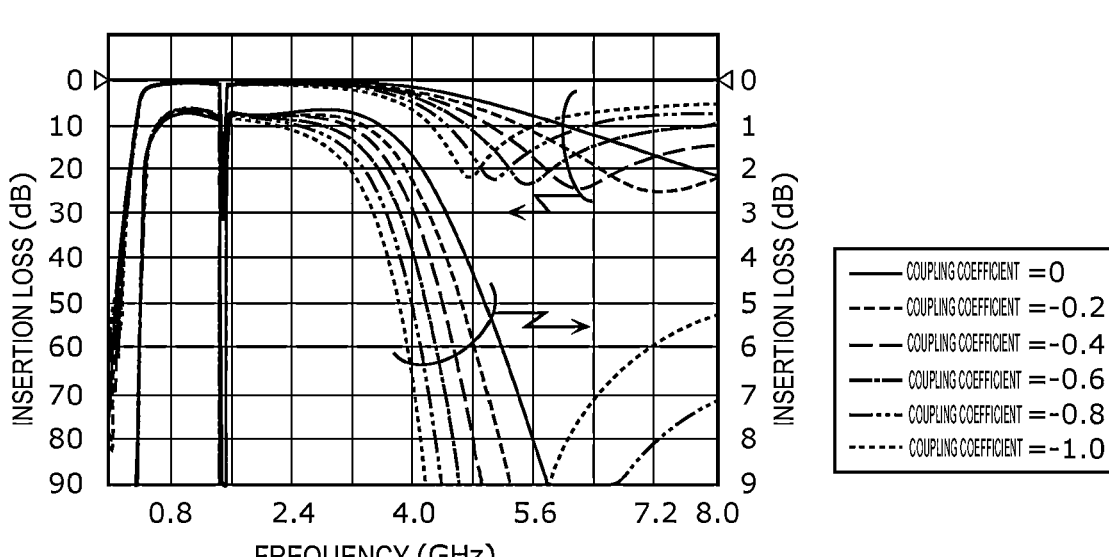
FIG. 6B is a graph indicating a result of comparison of the bandpass characteristics when the degree of capacitive coupling of the band elimination filter is varied.

FIG. 6B is a graph indicating a result of comparison of the bandpass characteristics when the degree of capacitive coupling is varied in the band elimination filter according to the comparative example. More specifically, the bandpass characteristics when the degree of capacitive coupling (the coupling coefficient) between the inductors 13 and 31 is varied from 0 to about −1.0 in the band elimination filter according to the comparative example are illustrated in FIG. 6B.

As illustrated in FIG. 6B, the insertion loss in the frequency band higher than the stop band of the band elimination filter is degraded as the coupling coefficient between the inductors 13 and 31 is decreased from 0 to about −1.0, that is, as the capacitive coupling is increased. Accordingly, it is desirable that the inductor 13 be not capacitively coupled to the inductor 31.

In other words, in the extractor LA according to the example, the inductor 13 is not capacitively coupled to the inductor 31 but is inductively coupled to the inductor 31.
Other Modifications and so on Although the extractors according to the preferred embodiments and the examples of the present invention are described above, the present invention is not limited to the preferred embodiments and the examples described above. For example, aspects embodied by modifying the preferred embodiments and the examples described above in the following manner are included in the present invention.

For example, although the GPS (registered trademark) band is exemplified as the stop band of the band elimination filter and the pass band of the band pass filter in the above example, either of the Wi-Fi (registered trademark) band (2.4-GHz band or 5-GHz band) and Band32 (the pass band: 1,452 MHz to 1,496 MHz) of Long Term Evolution (LTE) may be used as the stop band and the pass band.

In the above example, n77 in 5GNR may be included as the frequency band higher than the stop band or a 4G (LTE) communication band may be used as the frequency band higher than the stop band.

The extractors 1 and LA described above may have a configuration in which other band pass filters are connected to the input-output terminals 310 and 320 at the opposite side of the common terminal 330. Alternatively, the extractors 1 and LA described above may have a configuration in which a power amplifier (PA), a low noise amplifier (LNA), and the like are connected to the input-output terminals 310 and 320 at the opposite side of the common terminal 330.

In the extractor 1 according to the present preferred embodiment and the extractor 1A according to the example, other circuit elements, lines, and so on may be provided between the paths with which the respective circuit elements and the signal paths disclosed in the drawings are connected.

Preferred embodiments of the present invention, and examples and modifications thereof, are widely usable in a communication device, such as a mobile phone, which uses a front-end circuit, a transmission apparatus, a reception apparatus, or the like including the extractor supporting communications using different radio frequency bands and different radio systems.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An extractor comprising:
an external connection terminal, a common terminal, a first input-output terminal, and a second input-output terminal;
a band elimination filter that is connected between the common terminal and the first input-output terminal and that uses a first frequency band as a stop band;
a band pass filter that is connected between the common terminal and the second input-output terminal and that uses a second frequency band overlapped with at least a portion of the first frequency band as a pass band; and
a first inductor connected in series or in parallel on a path connecting the common terminal to the external connection terminal; wherein
the band elimination filter has a passband including frequencies above and below the stop band;
the band elimination filter is connected between the common terminal and the first input-output terminal without a band pass filter being connected between the band elimination filter and the first input-output terminal;
the band elimination filter includes:
one or more series arm resonators that each include an acoustic wave resonator and that are located on a series arm connecting the common terminal to the first input-output terminal;
a second inductor that is located on the series arm between the first input-output terminal and the series arm resonator closest to a side of the common terminal, among the one or more series arm resonators; and
one or more parallel arm circuits, each of the one or more parallel arm circuits includes a passive element connected between a corresponding node on the series arm and ground; and
any parallel arm circuit included in the band elimination filter does not include a resonator being connected between the corresponding node on the series arm and ground.

2. The extractor according to claim 1, wherein each acoustic wave resonator includes a piezoelectric substrate and interdigital electrodes.

3. The extractor according to claim 2, wherein the piezoelectric substrate includes a high acoustic velocity supporting substrate, a low acoustic velocity film, and a dielectric film.

4. The extractor according to claim 3, wherein the high acoustic velocity supporting substrate confines surface acoustic waves in a portion where the dielectric film and the low acoustic velocity film are laminated.

5. The extractor according to claim 3, wherein the high acoustic velocity supporting substrate is a silicon substrate.

6. The extractor according to claim 2, wherein the interdigital electrodes each include an interdigital transducer electrode including electrode fingers and busbar electrodes and a close-contact layer and a main electrode layer.

7. The extractor according to claim 1, wherein a direction of magnetic flux of the first inductor is the same as a direction of magnetic flux of the second inductor.

8. The extractor according to claim 7, further comprising:
a mounting substrate subjected to at least one of incorporation of the band elimination filter and the band pass filter therein and mounting of the band elimination filter and the band pass filter thereon; wherein
each of the first inductor and the second inductor includes a planar coil pattern in the mounting substrate; and
a winding axis direction of the planar coil pattern defining the first inductor is the same as a winding axis direction of the planar coil pattern defining the second inductor.

9. The extractor according to claim 7, wherein no conductive member is between the first inductor and the second inductor.

10. The extractor according to claim 1, wherein the external connection terminal connects an external device to the extractor, and the extractor is connectable to an antenna.

11. The extractor according to claim 10, wherein the extractor is configured to transmit a wireless signal to the antenna.

12. The extractor according to claim 1, wherein the second inductor is directly connected to the first input-output terminal with no element therebetween.

13. The extractor according to claim 1, wherein the first inductor includes an impedance element to match an impedance of an external device connected to the external connection terminal with a combined impedance of the band elimination filter and the band pass filter.

14. The extractor according to claim 1, wherein the band elimination filter includes a third inductor on a parallel arm connecting a node on the series arm to ground.

15. The extractor according to claim 1, wherein the first inductor and the second inductor are arranged so that a radio-frequency signal in a frequency band higher than the first frequency band is transmitted on a bypass path through the external connection terminal, the first inductor, the second inductor, and the first input-output terminal not through the one or more series arm resonators due to inductive coupling.

16. The extractor according to claim 1, wherein the band pass filter includes:
one or more series arm resonators that each include an acoustic wave resonator and that are located on a series arm connecting the common terminal to the second input-output terminal;
one or more parallel arm resonators that each include an acoustic wave resonator and that are located on parallel arms connecting nodes on the series arm to ground; and
a fourth inductor connected between the one or more parallel arm resonators and the ground.

17. The extractor according to claim 1, wherein each acoustic wave resonator is either a surface acoustic wave resonator or an acoustic wave resonator using bulk acoustic waves.

18. The extractor according to claim 1, wherein each acoustic wave resonator uses any of surface acoustic waves, Love waves, leaky waves, Rayleigh waves, boundary waves, leaky surface acoustic waves, pseudo surface acoustic waves, or plate waves.

19. The extractor according to claim 1, wherein the band pass filter includes LC resonant filters, dielectric filters or LC filters.

20. The extractor according to claim 2, wherein the first inductor and the second inductor have a same direction of magnetic flux.

21. The extractor according to claim 1, wherein the first inductor is inductively coupled to the second inductor.

22. An extractor comprising:

an external connection terminal, a common terminal, a first input-output terminal, and a second input-output terminal;

a band elimination filter that is connected between the common terminal and the first input-output terminal and that uses a first frequency band as a stop band;

a band pass filter that is connected between the common terminal and the second input-output terminal and that uses a second frequency band overlapped with at least a portion of the first frequency band as a pass band; and a first inductor connected in series or in parallel on a path connecting the common terminal to the external connection terminal; wherein the band elimination filter has a passband including frequencies above and below the stop band;

the band elimination filter includes:

one or more series arm resonators that each include an acoustic wave resonator and that are located on a series arm connecting the common terminal to the first input-output terminal;

a second inductor that is located on the series arm between the first input-output terminal and the series arm resonator closest to a side of the common terminal, among the one or more series arm resonators; and one or more parallel arm circuits, each of the one or more parallel arm circuits includes a passive element connected between a corresponding node on the series arm and ground; and any parallel arm circuit included in the band elimination filter does not include a resonator being connected between the corresponding node on the series arm and ground.

\* \* \* \* \*